United States Patent
Wang et al.

(10) Patent No.: US 10,510,537 B2
(45) Date of Patent: Dec. 17, 2019

(54) PIXEL STRUCTURE AND DRIVING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhidong Wang, Beijing (CN); Yun Qiu, Beijing (CN); Yanfeng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 124 days.

(21) Appl. No.: 15/722,510

(22) Filed: Oct. 2, 2017

(65) Prior Publication Data

US 2018/0190484 A1  Jul. 5, 2018

(30) Foreign Application Priority Data

Jan. 3, 2017  (CN) .......................... 2017 1 0001154

(51) Int. Cl.
*G02F 1/1362* (2006.01)
*H01L 21/02* (2006.01)
*G02F 1/1345* (2006.01)
*H01L 21/67* (2006.01)
*G02F 1/1343* (2006.01)

(52) U.S. Cl.
CPC ........ *H01L 21/0262* (2013.01); *G02F 1/1343* (2013.01); *G02F 1/13439* (2013.01); *G02F 1/13454* (2013.01); *G02F 1/136209* (2013.01); *G02F 1/136227* (2013.01); *H01L 21/02521* (2013.01); *H01L 21/67207* (2013.01)

(58) Field of Classification Search
None
See application file for complete search history.

(56) References Cited

U.S. PATENT DOCUMENTS

| | | | |
|---|---|---|---|
| 2011/0187764 A1* | 8/2011 | Bae .......................... | G09G 5/10 345/697 |
| 2016/0209681 A1* | 7/2016 | Hung ........................ | B32B 7/14 |

* cited by examiner

Primary Examiner — William R Alexander
Assistant Examiner — Gary W O'Neill

(57) ABSTRACT

A pixel structure, a driving method thereof, and a display device are provided. The accommodation chamber of the pixel structure includes: a first substrate and a second substrate opposite to each other, an accommodation space being formed therebetween; a light absorption layer in the accommodation space, including a flowable insulating liquid layer; a transparent thin film in the accommodation space, located between the insulating liquid layer and the second substrate, a refractive index of the transparent thin film being less than or equal to that of the insulating liquid layer. The accommodation chamber is in one of the at least two following states: in a first state, the insulating liquid layer is separated from the transparent thin film such that light rays from the second substrate are totally reflected; and in a second state, the insulating liquid layer and the transparent thin film at least are partially in direct contact.

20 Claims, 3 Drawing Sheets

PIXEL STRUCTURE AND DRIVING METHOD THEREOF, AND DISPLAY DEVICE

The application claims priority of Chinese Patent Application No. 201710001154.6 filed on Jan. 3, 2017, the disclosure of which is incorporated herein by reference in its entirety as part of the present application.

TECHNICAL FIELD

Embodiments of the present disclosure relate to a pixel structure and a driving method thereof, and a display device.

BACKGROUND

A reflective display device has attracted attention in display fields such as electronic book readers, advertisement boards, exhibition boxes, etc., due to its advantages of low power consumption, low cost and the like. For example, a total internal reflection (TIR)-based display technology has become a research hotspot because of its low cost and high compatibility with a Thin Film Transistor-Liquid Crystal Display (TFT-LCD) process.

The TIR refers to that in the case that light rays are incident to an optically thinner medium from an optically denser medium, all light rays will be reflected instead of entering into the optically thinner medium if an incident angle of the light rays is greater than or equal to a critical angle of total reflection.

SUMMARY

According to embodiments of the disclosure, a pixel structure is provided. The pixel structure comprises an accommodation chamber. The accommodation chamber includes: a first substrate; a second substrate, disposed opposite to the first substrate, wherein an accommodation space is formed between the first substrate and the second substrate; a light absorption layer, disposed in the accommodation space and including an insulating liquid layer that is flowable; and a transparent thin film, disposed in the accommodation space and located between the insulating liquid layer and the second substrate, wherein a refractive index of the transparent thin film is less than or equal to that of the insulating liquid layer. The accommodation chamber is configured to be in one of the at least two following states: in a first state, the accommodation chamber has a first volume, the insulating liquid layer is separated from the transparent thin film by a distance, such that light rays incident from the second substrate are totally reflected at a surface of the transparent thin film facing the insulating liquid layer; and in a second state, the accommodation chamber has a second volume, such that the insulating liquid layer and the transparent thin film at least are partially in direct contact with each other.

For example, the accommodation chamber has the first volume, the insulating liquid layer and the transparent thin film are separated from each other by a gas layer, and a refractive index of the gas layer is less than that of the transparent thin film.

For example, the accommodation chamber is provided with a gas hole allowing gas in the gas layer to pass; the accommodation chamber further includes a filter block layer disposed between the gas hole and the gas layer, and a blocking capacity of the filter block layer for a gas in the gas layer is less than a blocking capacity of the filter block layer for a liquid in the insulating liquid layer.

For example, the gas hole is disposed in the second substrate and located outside a region where the transparent thin film is provided.

For example, a projection of the transparent thin film on the second substrate does not overlap with a projection of the gas hole on the second substrate.

For example, the accommodation chamber further includes a gas transfer chamber therein, the gas transfer chamber includes an opening allowing the gas in the gas layer to pass and a filter block layer disposed between the opening and the gas layer, and a blocking capacity of the filter block layer for a gas in the gas layer is less than a blocking capacity of the filter block layer for a liquid in the insulating liquid layer.

For example, the gas transfer chamber is disposed to be not in contact with the transparent thin film.

For example, the gas transfer chamber is disposed within the insulating liquid layer, and the accommodation chamber has the first volume, a surface of the filter block layer of the gas transfer chamber facing the transparent thin film is flush with a surface of the insulating liquid layer facing the transparent thin film.

For example, the accommodation chamber includes a first side wall and a second side wall which are disposed oppositely, and the first side wall and the second side wall are configured to be bendable toward the insulating liquid layer so as to reduce a volume of the accommodation chamber.

For example, the first side wall includes a first electrode, the second side wall includes a second electrode, the first electrode and the second electrode intersect with the first substrate and the second substrate, and the first electrode and the second electrode are configured to be applied with signals of opposite electrical properties to reduce the volume of the accommodation chamber.

For example, thicknesses of the first electrode and the second electrode are 10 nm to 400 nm, and heights of the first electrode and the second electrode are 3 μm to 10 μm.

For example, the pixel structure further comprises a first switch element electrically connected to the first electrode and a second switch element electrically connected to the second electrode, and a signal applied to the first electrode by the first switch element is opposite to a signal applied to the second electrode by the second switch element in electric property.

For example, the insulating liquid layer is an insulating light absorption liquid layer.

For example, the light absorption layer further includes a light absorption solid layer, and the light absorption solid layer is disposed between the insulating liquid layer and the first substrate.

According to the embodiments of the disclosure, a display device is provided. The display device comprises a plurality of the pixel structures as described above.

For example, in each of the pixel structures, the accommodation chamber includes the first electrode and the second electrode which are disposed oppositely, the first electrode and the second electrode intersect with the first substrate and the second substrate, and the first electrode, the insulating liquid layer and the second electrode are arranged sequentially along a thickness direction of the first electrode; and the plurality of pixel structures include a first pixel structure and a second pixel structure which are adjacent to each other, and the second electrode of the first pixel structure and the first electrode of the second pixel structure are adjacent to each other and are applied with signals of a same electric property.

For example, the display device further comprises an insulating layer, and the second electrode of the first pixel structure and the first electrode of the first pixel structure are separated by the insulating layer.

According to the embodiments of the disclosure, a driving method of the pixel structure as described above. The accommodation chamber includes the first electrode and the second electrode which are disposed oppositely, the first electrode and the second electrode intersect with the first substrate and the second substrate, and the first electrode, the insulating liquid layer and the second electrode are sequentially arranged along a thickness direction of the first electrode; and the driving method comprising: respectively applying electric signals to the first electrode and the second electrode to change a volume of the accommodation chamber.

For example, the electric signals with opposite electric properties are respectively applied to the first electrode and the second electrode to reduce the volume of the accommodation chamber.

For example, the electric signals with a same electric properties are respectively applied to the first electrode and the second electrode to increase the volume of the accommodation chamber.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Figure 1A:
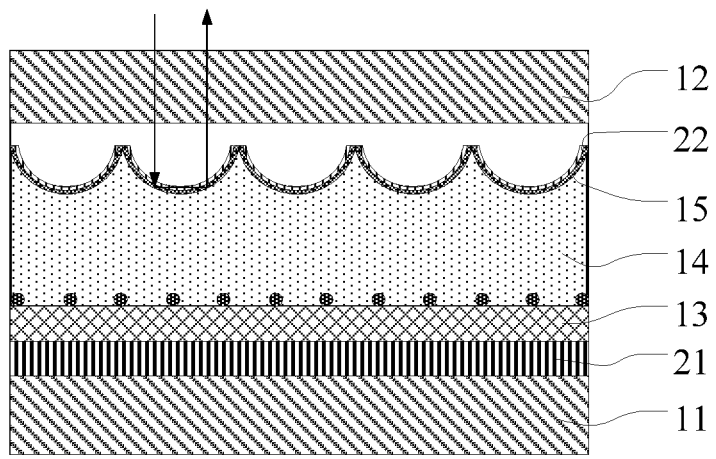
FIG. 1a is a schematic view illustrating a reflective display device in a bright state.
Figure 1B:
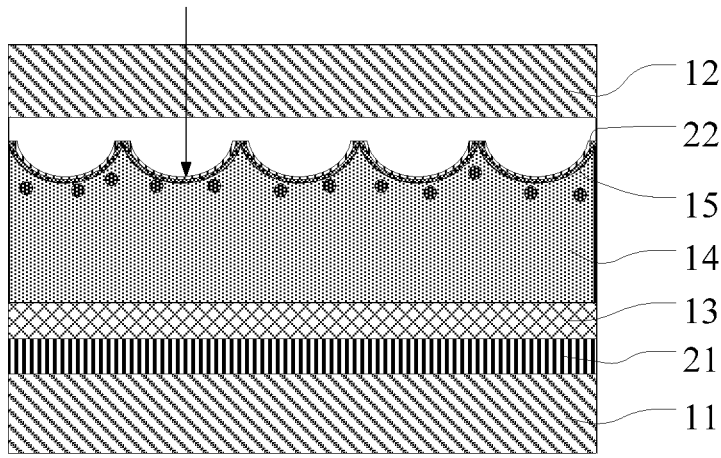
FIG. 1b is a schematic view illustrating the reflective display device in a dark state.

For example, FIGS. 1a and 1b provide a total internal reflection-based reflective display device, including a lower substrate 11 and an upper substrate 12 which are disposed oppositely, and a lower transparent electrode 21, an insulating layer 13, a medium liquid 14, a dielectric layer 15 and an upper transparent electrode 22 which are disposed between the upper substrate and the lower substrate in sequence, black particles with negative electricity are dispersed in the medium liquid 14, and the lower surfaces of both the upper transparent electrode 22 and the dielectric layer 15 have a plurality of semispherical structures to improve reflectivity.

An operation principle of the reflective display device is described as follows. In the case that a negative voltage and a positive voltage are respectively applied to the upper transparent electrode and the lower transparent electrode, the black particles with negative electricity in the medium liquid 14 are attracted to an upper surface of the lower substrate 11, as shown in FIG. 1a, the lower surface of the dielectric layer 15 having the semispherical structures is surrounded by the medium liquid 14 with a low refractive index, such that the lower surface of the dielectric layer 15 reflects incident ambient light (referring to arrows in FIG. 1a), and therefore, the reflective display device displays a bright state; in the case that the positive voltage and negative voltage are respectively applied to the upper transparent electrode and the lower transparent electrode, the black particles with negative electricity in the medium liquid 14 are attracted to the lower surface of the dielectric layer 15 having the semispherical structures, such that the lower surface of the dielectric layer 15 is surrounded by the black particles, and the incident ambient light (referring to the arrows in FIG. 1b) is absorbed by the black particles, and therefore, the reflective display device displays a dark state.

Inventors of the present disclosure note that in the reflective display device as shown in FIGS. 1a and 1b, the lower surface of the upper transparent electrode 22 has a plurality of semispherical structures, the lower transparent electrode 21 is a planar electrode, and therefore, a distance between the upper transparent electrode and the lower transparent electrode is variable; as a result, an electric field between the upper transparent electrode and the lower transparent electrode is uneven; such uneven electric field leads to uneven distribution of the black particles during the dark state, and therefore, part of the lower surface of the dielectric layer 15 is not covered by the black particles during the dark state; as a result, such part of the lower surface of the dielectric layer 15 reflects the incident ambient light during the dark state, that is, a light leakage phenomenon occurs during the dark state.

The embodiments of the present disclosure provide a pixel structure and a driving method thereof, and a display device. By changing a volume of an accommodation chamber that the pixel structure comprises, a total reflection state at a surface of a transparent thin film in the accommodation chamber is changed to realize two different display modes of a bright state and a dark state, and the light leakage phenomenon of the reflective display device during the dark state is avoided.

Figure 2:
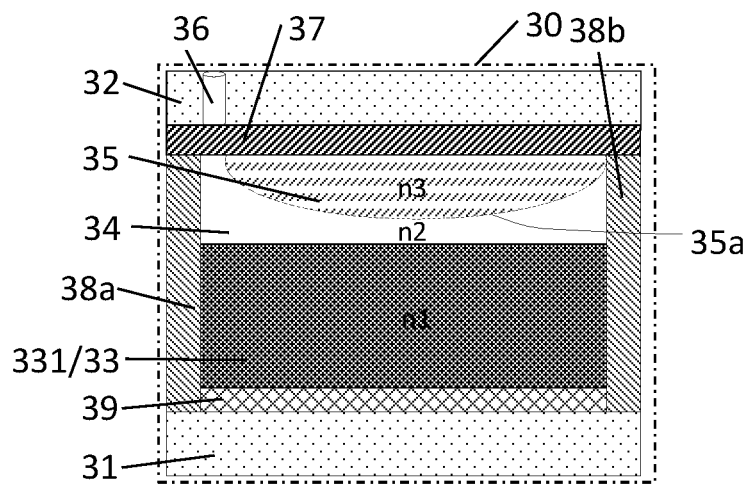
FIG. 2 is a schematic view illustrating a pixel structure provided by embodiments of the present disclosure.
Figure 3A:
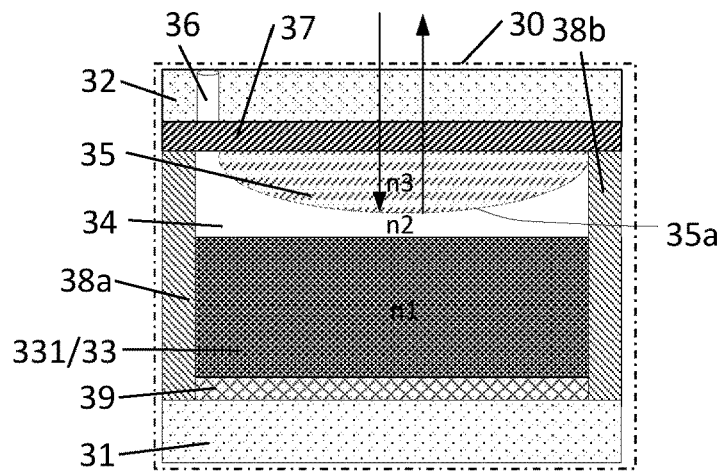
FIG. 3a is a schematic view illustrating the pixel structure shown in FIG. 2 in a bright state.
Figure 3B:
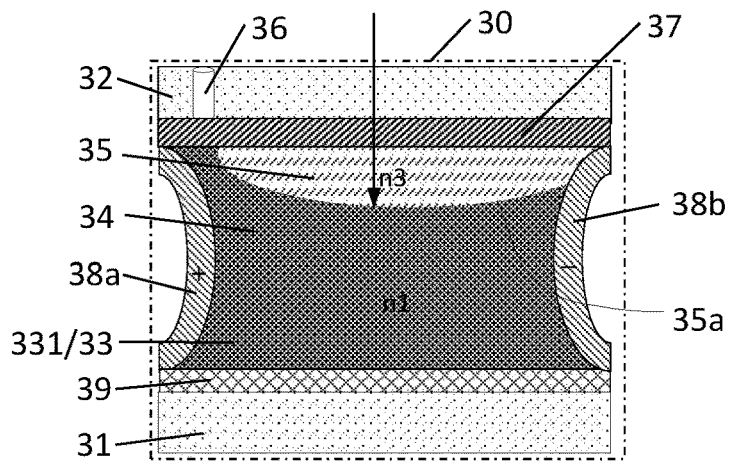
FIG. 3b is a schematic view illustrating the pixel structure shown in FIG. 2 in a dark state.

At least one embodiment of the present disclosure provides a pixel structure. As shown in FIG. 2, the pixel structure comprises an accommodation chamber 30, the accommodation chamber 30 includes: a first substrate 31; a second substrate 32, disposed opposite to the first substrate 31, an accommodation space being formed between the first substrate 31 and the second substrate 32; a light absorption layer 33, disposed in the accommodation space and including a flowable insulating liquid layer 331 having a refractive index n1; and a transparent thin film 35, disposed in the accommodation space and located between the insulating liquid layer 331 and the second substrate 32 and having a refractive index n3. The refractive index n3 of the transparent thin film 35 is less than or equal to the refractive index n1 of the insulating liquid layer 331. In the pixel structure, the accommodation chamber 30 is configured to be volume-variable to change a contact state between the insulating liquid layer 331 and the transparent thin film 35, so as to change a total reflection state at an interface between the insulating liquid layer 331 and the transparent thin film 35. For example, as shown in FIGS. 3a and 3b, the accommodation chamber 30 is configured to be in one of the at least two following states: in a first state, the accommodation chamber 30 has a first volume, the insulating liquid layer 331 is separated from the transparent thin film 35 by a distance, such that the light rays (shown by an arrow) incident from the second substrate 32 are totally reflected at a surface 35a (short for the lower surface 35a hereinafter) of the transparent thin film 35 facing the insulating liquid layer 331; in a second state, the accommodation chamber 30 has a second volume less than the first volume, such that the insulating liquid layer 331 and the transparent thin film 35 at least are partially in direct contact with each other. For example, in a case that the insulating liquid layer 331 is in direct contact with the whole lower surface 35a of the transparent thin film 35, the pixel structure realizes the dark state display; and for example, in a case that the insulating liquid layer 331 is in direct contact with a part of the transparent thin film 35a, the pixel structure realizes gray scale display states between the bright state and the dark state.

For example, as shown in FIG. 2, in the case that the accommodation chamber 30 has the first volume, the insulating liquid layer 331 and the transparent thin film 35 are separated from each other by a gas layer 34, and a refractive index n2 of the gas layer is less than the refractive index n3 of the transparent thin film 35, such that the light rays incident from the second substrate 32 are totally reflected at the lower surface 35a of the transparent thin film 35.

An operation principle of the pixel structure is explained in combination with FIGS. 3a and 3b.

For example, as shown in FIG. 3a, the side where the second substrate 32 is positioned is a light incident side of the pixel structure, the accommodation chamber 30 is configured to have the first volume, such that the insulating liquid layer 331 and the transparent thin film 35 are separated from each other by a gas layer, in such case, when the incident light rays are incident from the transparent thin film 35 with the larger refractive index to the gas layer 34 with the smaller refractive index, total reflection occurs at an interface between the transparent thin film 35 and the gas layer 34, and therefore, the pixel structure realizes the bright state display. For example, as shown in FIG. 3b, the accommodation chamber 30 is configured to have the second volume less than the first volume, such that the insulating liquid layer 331 is in direct contact with the transparent thin film 35; in such case, since the refractive index n3 of the transparent thin film 35 is less than or equal to the refractive index n1 of the insulating liquid layer 331, no total reflection occurs at the interface between the transparent thin film 35 and the insulating liquid layer 331, the incident light rays are transmitted through the transparent thin film 35 and are then absorbed by the light absorption layer 33, so as to realize dark state display.

It can be seen from FIG. 3b that in the embodiments of the present disclosure, the whole lower surface 35a of the transparent thin film 35 is covered by the insulating liquid layer 331 to realize the dark state display; since charged black particles are not adopted, the light leakage under the dark state caused by uneven distribution of the charged black particles in the reflective display device as shown in FIG. 1b can be avoided.

For example, as shown in FIG. 2, the accommodation chamber 30 includes a first side wall 38a and a second side wall 38b which are disposed oppositely, and the accommodation space is formed by the first side wall 38a, the second side wall 38b, the first substrate 31 and the second substrate 32 to contain the insulating liquid layer 331, the gas layer 34 and the transparent thin film 35. For example, the first side wall 38a and the second side wall 38b are configured to be bendable toward the insulating liquid layer 331 (as shown in FIG. 3b), such that the volume of the accommodation chamber 30 is reduced to enable the insulating liquid layer 331 to cover at least part of the lower surface 3a of the transparent thin film 35.

For example, the first and second side walls are manufactured by adopting a material having flexibility (for example, a flexible metal material) so that the first and second side walls have a bendable capacity.

For example, electric signals are applied to the first side wall 38a and the second side wall 38b to make them bend. For example, the first side wall 38a includes a first electrode, and the second side wall 38b includes a second electrode. For example, the first electrode and the second electrode are configured to be applied with signals of opposite electric properties to change the volume of the accommodation chamber 30. In a case that a positive voltage is applied to one of the first electrode and the second electrode and a negative voltage is applied to the other of the first electrode and the second electrode, as shown in FIG. 3b, because of an electrostatic attraction force between the first electrode and the second electrode, the first electrode and the second electrode are attracted to each other, and therefore, a distance between the first electrode and the second electrode is reduced, the volume of the accommodation chamber is reduced accordingly, and further, a liquid surface of the insulating liquid layer 331 rises till the whole lower surface 35a of the transparent thin film 35 is covered to realize dark state display. In a case that no voltage is applied to the first electrode and the second electrode, the first electrode and the second electrode are restored to a non-bended state, the volume of the accommodation chamber is increased accordingly, such that the insulating liquid layer 331 and the transparent thin film 35 are separated from each other by the gas layer 34, as shown in FIG. 3a. For example, the positive voltage or the negative voltage is applied to both the first electrode and the second electrode to increase the volume of the accommodation chamber.

For example, the first side wall 38a is consisted of the first electrode only, and the second side wall 38b is consisted of the second electrode only. For example, the first side wall includes other structures except the first electrode, and the second side includes other structures except the second electrode.

In order to enable the first and second electrodes to be easily bended, the first and second electrodes are made thinner. For example, thicknesses of the first electrode and the second electrode (i.e., the size in a direction from the first electrode to the second electrode, referring to the horizontal direction in FIG. 2) are both 10 nm to 400 nm, and heights of the first electrode and the second electrode (the size in a direction from the first substrate to the second substrate, referring to the vertical direction in FIG. 2) are both 3 μm to 10 μm.

For example, a material for forming the first electrode and a material for forming the second electrode are both metal, for example, copper, copper alloy, aluminum, aluminum neodymium alloy, titanium, zirconium, molybdenum, molybdenum niobium alloy, etc.

For example, the first and second electrodes are manufactured by a Micro Electro-Mechanical Systems (MEMS) or a microfabrication process. These manufacturing processes can be used for preparing the microstructures from a nanometer scale to a millimeter scale. The MEMS manufacturing process in the broad sense is a micromachining process for manufacturing a three-dimensional object by taking photoetching, epitaxy, thin film deposition, oxidizing, diffusion, injection, sputtering, evaporation, etching, scribing and packaging as basic process steps.

Figure 4:
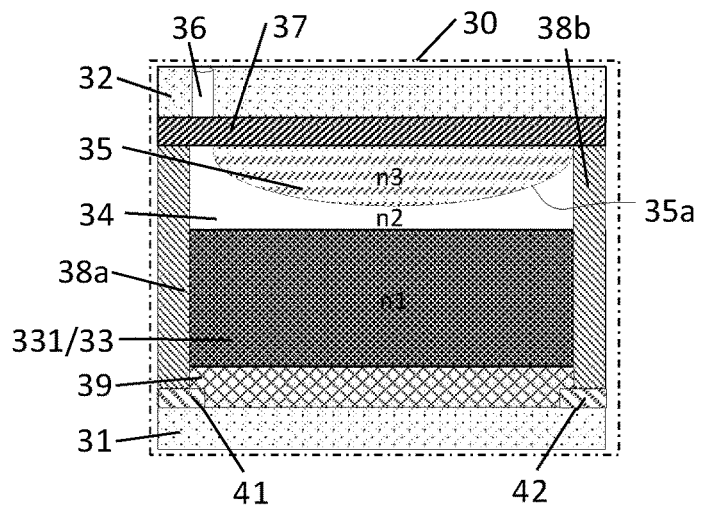
FIG. 4 is a schematic view illustrating that the pixel structure provided by the embodiments of the present disclosure comprises a first switch element and a second switch element.

For example, different voltages are respectively applied to the first and second electrodes through different elements. For example, as shown in FIG. 4, the pixel structure provided by at least one embodiment of the present disclosure further comprises a first switch element 41 electrically connected to the first electrode and a second switch element 42 electrically connected to the second electrode. For example, a signal applied to the first electrode by the first switch element 41 and a signal applied to the second electrode by the second switch element 42 are opposite in electric property.

For example, the first switch element 41 and the second switch element 42 are both transistors, for example, thin film transistors, and for example, formed on the first substrate. For example, the pixel structure comprises a gate line and a data line which intersect with each other, a gate electrode of the first switch element 41 is connected to the gate line, a source electrode of the first switch element 41 is connected to the data line, and a drain electrode of the first switch element 41 is connected to the first electrode. The second switch element 42 is disposed similarly, that is, a gate electrode of the second switch element 42 is connected to the gate line, a source electrode of the second switch element 42 is connected to the data line, and a drain electrode of the second switch element 42 is connected to the second electrode. Besides, the source electrode of the first switch element and the source electrode of the second switch element are connected to different data lines to respectively apply different voltages to the first and second electrodes.

For example, as shown in FIGS. 2 and 4, the pixel structure further comprises an insulating layer 39 disposed between the insulating liquid layer 331 and the first substrate 31. In a case that the first substrate 31 is provided with the structures such as the gate line, the data line and the switch elements, the insulating layer 39 is employed to protect these structures.

In the embodiments of the present disclosure, in one aspect, the gas layer 34 is used for providing the refractive index n2, such that the total reflection occurs at the interface between the transparent thin film 35 and the gas layer 34; in the other aspect, the volume of the gas layer 34 is changed along with the change of the volume of the accommodation chamber 30, so as to realize the change of the contact state between the transparent thin film 35 and the insulating liquid layer 331. A change manner of the volume of the gas layer 34 is explained in detail hereinafter.

For example, as shown in FIG. 2, the accommodation chamber 30 is disposed with a gas hole 36 allowing gas in the gas layer 34 to pass; besides, the accommodation chamber 30 further includes a filter block layer 37 disposed between the gas hole 36 and the gas layer 34, and a blocking capacity of the filter block layer 37 for the gas in the gas layer 34 is less than a blocking capacity of the filter block layer 37 for the liquid in the insulating liquid layer 331, such that the gas passes but the liquid is blocked.

In the embodiments of the present disclosure, in the case that the volume of the accommodation chamber 30 is reduced, the gas in the gas layer 34 penetrates through the filter block layer 37 and is discharged out of the accommodation chamber 30 through the gas hole 36; when the gas in the gas layer 34 is totally discharged, the transparent thin film 35 is in contact with the insulating liquid layer 331 because the liquid in the insulating liquid layer 331 is blocked by the filter block layer 37 (for example, cannot penetrate through the filter block layer 37), and at least part of the lower surface 35a of the transparent thin film 35 is covered by the insulating liquid layer 331, as shown in FIG. 3b. In addition, in the case that the volume of the accommodation chamber 30 is gradually increased, a gap is formed between the transparent thin film 35 and the insulating liquid layer 331 and the gap is gradually increased, and outside gas penetrates through the gas hole 36 and the filter block layer 37 to enter into the accommodation chamber 30 so as to fill the gap, such that the transparent thin film 35 and the insulating liquid layer 331 are separated from each other.

For example, as shown in FIG. 2, the gas hole 36 is disposed in the second substrate 32 and located outside a region where the transparent thin film 35 is provided, such that the gas passes by the gas hole 36. For example, the filter block layer 37 is adhered to the second substrate 32. For example, the filter block layer 37 is adhered to a surface of the second substrate 32 facing the transparent thin film 35. For example, a projection of the transparent thin film 35 on the second substrate 32 does not overlap with a projection of the gas hole 36 on the second substrate 32.

For example, an opening of the gas hole 36 provided at the upper surface (i.e., the surface facing away from the first substrate 31) of the second substrate 32 is exposed in air, and in such case, the gas layer 34 is an air layer. The refractive index of air is about 1, and in such case, for example, the refractive index of the transparent thin film 35 is about 1.8.

Figure 5:
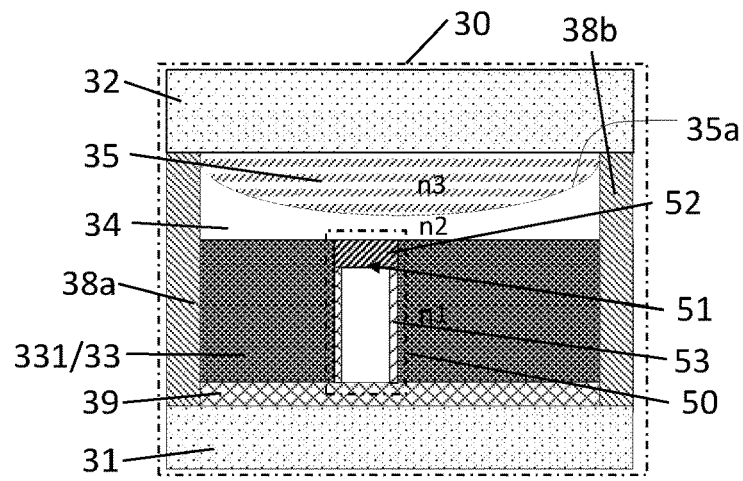
FIG. 5 is a schematic view illustrating that the pixel structure provided by the embodiments of the present disclosure comprises a gas transfer chamber.

Except that the volume of the gas layer 34 is changed by disposing the gas hole 36 and the filter block layer 37, a gas transfer chamber for example is disposed in the accommodation chamber to change the volume of the gas layer 34. For example, as shown in FIG. 5, the accommodation chamber 30 further includes the gas transfer chamber 50 disposed therein, the gas transfer chamber 50 includes an opening 51 allowing the gas in the gas layer 34 to pass and a filter block layer 52 disposed between the opening 51 and the gas layer 34, a blocking capacity of the filter block layer 52 for the gas in the gas layer 34 is less than a blocking capacity of the filter block layer 52 for the liquid in the insulating liquid layer 331, such that the gas passed but the liquid is blocked. In the embodiments of the present disclosure, in the case that the volume of the accommodation chamber 30 is reduced, the gas in the gas layer 34 penetrates through the filter block layer 52 to enter into the gas transfer chamber 50 through the opening 51, and the liquid in the insulating liquid layer 331 is blocked by the filter block layer 52 (for example, cannot penetrate through the filter block layer 52), and therefore, the liquid surface of the insulating liquid layer 331 rises, and the insulating liquid layer 331 covers the whole lower surface 35a of the transparent thin film 35 in a case that the gas in the gas layer 34 all enters into the gas transfer chamber 50.

For example, the gas transfer chamber 50 is disposed to be not in contact with the transparent thin film 35. For example, as shown in FIG. 5, the gas transfer chamber 50 is disposed within the insulating liquid layer 331. Besides, in the case that the accommodation chamber 30 has the first volume, a surface of the filter block layer 52 of the gas transfer chamber 50 facing the transparent thin film 35 is flush with a surface of the insulating liquid layer 331 facing the transparent thin film 35.

For example, the side wall 53 of the gas transfer chamber 50 is manufactured by an insulating material to avoid an influence from an electric field between the first electrode and the second electrode. For example, the side wall 53 of the gas transfer chamber 50 is formed by performing patterning processing on an insulating thin film through a photoetching process; afterwards, the filter block layer 52 is adhered to a top end of the side wall 53 to form the gas transfer chamber 50. For example, in the case of adopting the gas transfer chamber 50, the gas in the gas layer 34 is air or other gases selected according to needs. For example, the side wall 53 of the gas transfer chamber 50 having flexibility (for example, a material for forming the side wall 53 of the gas transfer chamber 50 is a flexible insulating material); in the case that the gas in the gas layer 34 enters into the gas transfer chamber 50, the side wall 53 of the gas transfer chamber 50 bends outwards (for example, the side wall 53 close to the first side wall 38a bends towards the first side wall 38a, the side wall 53 close to the second side wall 38b bends towards the second side wall 38b) so that the volume of the gas transfer chamber 50 is increased to accommodate the gas from the gas layer 34.

For example, for the embodiments as shown in FIGS. 2 and 5, the filter block layers 37 and 52 are both a separation film for separating gas from liquid or a waterproof ventilation film, for example, are both a porous film whose aperture has a size less than a size of the liquid particle in the insulating liquid layer 331. For example, the waterproof ventilation film adopts a polyurethane (PU) film, a thermoplastic polyurethane (TPU) film or a polytetrafluoroethylene (EPTFE) film, etc.

For example, the incident light rays are absorbed by the insulating liquid layer 331 per se, in such case, the insulating liquid layer 331 is an insulating light absorption liquid layer (light absorbing particles in the liquid are uncharged), such as, a black light absorption liquid layer (including Sudan black dye), a red light absorbing liquid layer (including Sudan red dye) and other nonwhite liquid layers.

Figure 6:
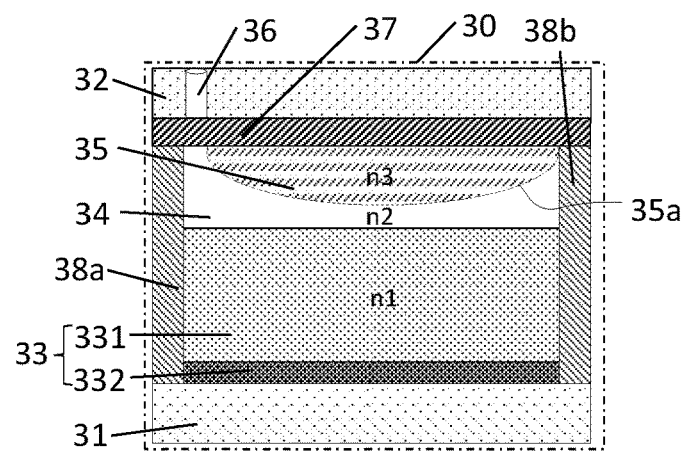
FIG. 6 is a schematic view illustrating that a light absorption layer in the pixel structure provided by the embodiments of the present disclosure comprises a light absorption solid layer.

For example, the incident light rays are absorbed by other structures in the light absorption layer 33. For example, as shown in FIG. 6, the light absorption layer 33 includes a light absorption solid layer 332 disposed between the insulating liquid layer 331 and the first substrate 31. In a case that the light absorption layer 33 includes the light absorption solid layer 332, the insulating liquid layer 331 absorbs light or is transparent as long as it is ensured that the refractive index of the insulating liquid layer 331 is greater than or equal to that of the transparent thin film 35.

For example, an orthogonal projection of the transparent thin film 35 on the light absorption solid layer 332 is located within the light absorption solid layer 332 to avoid light leakage under the dark state. For example, the light absorption solid layer 332 is a black light absorption solid layer, a red light absorption solid layer and other nonwhite solid layers. For example, the light absorption solid layer 332 is an insulating layer (for example, is made of an organic or inorganic insulating material), to protect the structures such as the switch elements, signal lines and the like on the first substrate 31. For example, in the case that the light absorption solid layer 332 is the insulating layer, the insulating layer 39 mentioned above can be omitted.

In any embodiments above of the present disclosure, for example, the first and second substrates are transparent substrates such as glass substrates, quartz substrates or plastic substrates; for example, the lower surface 35a of the transparent thin film 35 is a plane or curved surface, and for example, the lower surface is a semispherical surface to improve reflectivity.

At least one embodiment of the present disclosure further provides a display device, comprising a plurality of pixel structures provided by any one of the embodiments above.

Figure 7:
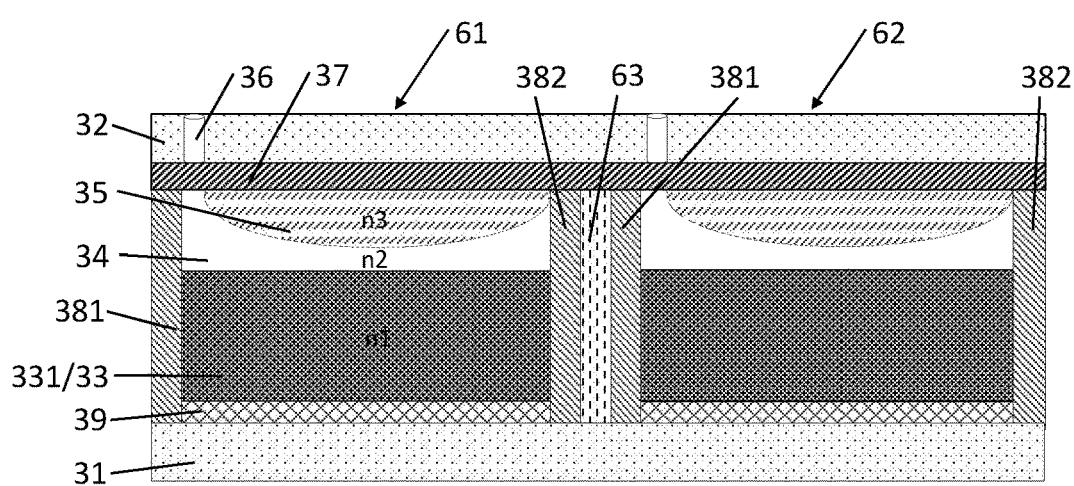
FIG. 7 is a partial schematic view illustrating a display device provided by the embodiments of the present disclosure.

For example, as shown in FIG. 7, the accommodation chamber 30 in each pixel structure includes the first electrode 381 and the second electrode 382 which are disposed oppositely, and the first electrode 381, the insulating liquid layer 331 and the second electrode 382 are arranged in sequence along a thickness direction of the first electrode 381; the plurality of pixel structures in the display device include a first pixel structure 61 and a second pixel structure 62 which are adjacent to each other, the second electrode 382 of the first pixel structure 61 and the first electrode 381 of the second pixel structure 62 are adjacent and are applied with signals of the same electric property. In the embodiments of the present disclosure, a positive electric signal or a negative electric signal is applied to the adjacent electrodes of the adjacent pixel structures, mutual attraction between the adjacent electrodes (for example, the second electrode 382 of the first pixel structure 61 and the first electrode 381 of the second pixel structure 62) of the adjacent pixel structures are avoided, and an influence on the change of the volume of the accommodation chamber is also avoided.

For example, as shown in FIG. 7, the display device provided by at least one embodiment of the present disclosure further comprises an insulating layer 63, the second electrode 382 of the first pixel structure 61 and the first electrode 381 of the second pixel structure 62 are separated from each other by the insulating layer 63. The adjacent electrodes of the adjacent pixel structures are separated by the insulating layer 63, and short circuit between the adjacent electrodes is avoided.

At least one embodiment of the present disclosure further provides a driving method of the pixel structure provided by any one of the embodiments above. In the pixel structure, as shown in FIG. 4, the accommodation chamber 30 includes the first electrode (referring to 38a) and the second electrode (referring to 38b) which are disposed oppositely, and the first electrode, the insulating liquid layer and the second electrode are sequentially arranged along a thickness direction (the horizontal direction in FIG. 4) of the first electrode; the driving method of the pixel structure comprises: applying electric signals to the first electrode and the second electrode respectively to change the volume of the accommodation chamber 30. For example, the electric signals with the opposite electric properties are respectively applied to the first electrode and the second electrode to reduce the volume of the accommodation chamber; and for example, the electric signals with the same electric properties are respectively applied to the first electrode and the second electrode to increase the volume of the accommodation chamber.

For example, the electric signal is applied to the first electrode by the first switch element 41, and the electric signal is applied to the second electrode by the second switch element 42, such that the electric signals applied to the first and second electrodes are opposite in electric property.

The embodiments of the pixel structure and the driving method thereof and the display device are mutually referable, and will not be repeated.

There are some following points needing to be explained: (1) the drawings of the embodiments of the present disclosure only involve the structures related to the embodiments of the present disclosure, and other structures can refer to a general design; (2) the sizes and shapes of respective structures in the drawings do not reflect a true proportion, and merely are intended to explain the content of the embodiments of the present disclosure schematically; and (3) in case of no conflict, the embodiments and the features in the embodiments of the present disclosure can be mutually combined.

The foregoing embodiments merely are exemplary embodiments of the disclosure, and not intended to define the scope of the disclosure, and the scope of the disclosure is determined by the appended claims.

The invention claimed is:

1. A pixel structure, comprising an accommodation chamber,
   wherein the accommodation chamber includes:
   a first substrate;
   a second substrate, disposed opposite to the first substrate, wherein an accommodation space is formed between the first substrate and the second substrate;
   a light absorption layer, disposed in the accommodation space and including an electrically insulating liquid layer that is flowable; and
   a transparent thin film, disposed in the accommodation space and located between the electrically insulating liquid layer and the second substrate, wherein a refractive index of the transparent thin film is less than or equal to that of the electrically insulating liquid layer;
   wherein the accommodation chamber is configured to be in one of the at least two following states:
   in a first state which is a bright state of the pixel structure, the accommodation chamber has a first volume, the electrically insulating liquid layer is separated from the transparent thin film by a distance, such that light rays incident from the second substrate are totally reflected at a surface of the transparent thin film facing the electrically insulating liquid layer; and in a second state which is a dark state or a gray scale display state of the pixel structure, the accommodation chamber has a second volume, such that the electrically insulating liquid layer and the transparent thin film at least are partially in direct contact with each other.

2. The pixel structure according to claim 1, wherein the accommodation chamber has the first volume, the electrically insulating liquid layer and the transparent thin film are separated from each other by a gas layer, and a refractive index of the gas layer is less than that of the transparent thin film.

3. The pixel structure according to claim 2, wherein the accommodation chamber is provided with a gas hole allowing gas in the gas layer to pass; the accommodation chamber further includes a filter block layer disposed between the gas hole and the gas layer, and a blocking capacity of the filter block layer for a gas in the gas layer is less than a blocking capacity of the filter block layer for a liquid in the electrically insulating liquid layer.

4. The pixel structure according to claim 3, wherein the gas hole is disposed in the second substrate and located outside a region where the transparent thin film is provided.

5. The pixel structure according to claim 4, wherein a projection of the transparent thin film on the second substrate does not overlap with a projection of the gas hole on the second substrate.

6. The pixel structure according to claim 2, wherein the accommodation chamber further includes a gas transfer chamber therein, the gas transfer chamber includes an opening allowing the gas in the gas layer to pass and a filter block layer disposed between the opening and the gas layer, and a blocking capacity of the filter block layer for a gas in the gas layer is less than a blocking capacity of the filter block layer for a liquid in the electrically insulating liquid layer.

7. The pixel structure according to claim 6, wherein the gas transfer chamber is disposed to be not in contact with the transparent thin film.

8. The pixel structure according to claim 7, wherein the gas transfer chamber is disposed within the electrically insulating liquid layer, and
   the accommodation chamber has the first volume, a surface of the filter block layer of the gas transfer chamber facing the transparent thin film is flush with a surface of the electrically insulating liquid layer facing the transparent thin film.

9. The pixel structure according to claim 1, wherein the accommodation chamber includes a first side wall and a second side wall which are disposed oppositely, and the first side wall and the second side wall are configured to be bendable toward the electrically insulating liquid layer so as to reduce a volume of the accommodation chamber.

10. The pixel structure according to claim 9, wherein the first side wall includes a first electrode, the second side wall includes a second electrode, the first electrode and the second electrode intersect with the first substrate and the second substrate, and the first electrode and the second electrode are configured to be applied with signals of opposite electrical properties to reduce the volume of the accommodation chamber.

11. The pixel structure according to claim 10, wherein thicknesses of the first electrode and the second electrode are 10 nm to 400 nm, and heights of the first electrode and the second electrode are 3 μm to 10 μm.

12. The pixel structure according to claim 10, further comprising a first switch element electrically connected to the first electrode and a second switch element electrically connected to the second electrode, and a signal applied to the first electrode by the first switch element is opposite to a signal applied to the second electrode by the second switch element in electric property.

13. The pixel structure according to claim 1, wherein the electrically insulating liquid layer is an insulating light absorption liquid layer.

14. The pixel structure according to claim 1, wherein the light absorption layer further includes a light absorption solid layer, and the light absorption solid layer is disposed between the electrically insulating liquid layer and the first substrate.

15. A display device, comprising a plurality of the pixel structures according to claim 1.

16. The display device according to claim 15, wherein
in each of the pixel structures, the accommodation chamber includes the first electrode and the second electrode which are disposed oppositely, the first electrode and the second electrode intersect with the first substrate and the second substrate, and the first electrode, the electrically insulating liquid layer and the second electrode are arranged sequentially along a thickness direction of the first electrode; and
the plurality of pixel structures include a first pixel structure and a second pixel structure which are adjacent to each other, and the second electrode of the first pixel structure and the first electrode of the second pixel structure are adjacent to each other and are applied with signals of a same electric property.

17. The display device according to claim 16, further comprising an insulating layer, wherein the second electrode of the first pixel structure and the first electrode of the first pixel structure are separated by the insulating layer.

18. A driving method of the pixel structure according to claim 1, wherein the accommodation chamber includes the first electrode and the second electrode which are disposed oppositely, the first electrode and the second electrode intersect with the first substrate and the second substrate, and the first electrode, the electrically insulating liquid layer and the second electrode are sequentially arranged along a thickness direction of the first electrode; and
the driving method comprising: respectively applying electric signals to the first electrode and the second electrode to change a volume of the accommodation chamber.

19. The driving method according to claim 18, wherein the electric signals with opposite electric properties are respectively applied to the first electrode and the second electrode to reduce the volume of the accommodation chamber.

20. The driving method according to claim 18, wherein the electric signals with a same electric properties are respectively applied to the first electrode and the second electrode to increase the volume of the accommodation chamber.

* * * * *